United States Patent [19]

Yazar

[11] Patent Number: 4,496,901

[45] Date of Patent: Jan. 29, 1985

[54] ELECTROEXPLOSIVES, RF POWER SAFETY MARGIN MEASUREMENT METHOD

[75] Inventor: M. Nihat Yazar, Nepean, Canada

[73] Assignee: Her Majesty the Queen in Right of Canada, as represented by the Minister of National Defence, Ottawa, Canada

[21] Appl. No.: 379,101

[22] Filed: May 17, 1982

[30] Foreign Application Priority Data

Jun. 8, 1981 [CA] Canada ................................. 379246

[51] Int. Cl.³ .................... G01R 21/04; G01R 35/00
[52] U.S. Cl. ........................................ 324/95; 324/74; 324/142
[58] Field of Search ................... 324/95, 142, 132, 74, 324/158 R

[56] References Cited

U.S. PATENT DOCUMENTS 3,571,706  3/1971  Bjor ..................................... 324/132
4,060,763  11/1977  Hassler ............................... 324/132

Primary Examiner—Ernest F. Karlsen
Attorney, Agent, or Firm—Stevens, Davis, Miller & Mosher

[57] ABSTRACT

Disclosed is a method of measuring the effective power absorbed by a resistive device such as an electroexplosive (or substitute) device due to radio-frequency (rf) energy induced in an electrical line connected to the device. The method comprises calibrating a device by passing dc currents of known value through it and measuring the voltage across it. Knowing the voltage and current, one can calculate resistance and power dissipation. By then connecting the device to an electrical line, one can measure the power dissipation and resistance and subtract the power dissipation due to the dc current to obtain the power dissipation due to rf power on the electrical line.

8 Claims, 4 Drawing Figures

ELECTROEXPLOSIVES, RF POWER SAFETY MARGIN MEASUREMENT METHOD

This invention relates to a method of measuring the effective power absorbed by a resistive device such as an electroexplosive (or substitute) device due to radio-frequency (rf) energy induced in an electrical line connected to the device.

Electroexplosive devices present an obvious safety hazard because of the possibility that they might be detonated by stray rf energy induced in an electrical line connected to the device. Electromagnetic compatibility requirements of installed military systems call for a 20 dB safety margin for explosives. All wiring and cabling must be designed to prevent stray pick up and eliminate undesired energy. The shielding attenuation of electroexplosive device lines must be better than 40 dB to 60 dB over a wide frequency range.

Almost all electroexplosive devices are of the hot-wire type, creating heating for explosion by the joule effect. One of the most common undesirable activating modes is by radio-frequency energy capture by lines connected to the electroexplosive device. Typical ordnance hazard sources are the transmitters on vehicles and transmitters, radars, etc. on the ground.

The shielding and therefore the safety margin should be demonstrated by reliable tests according to limits set by relevant standards. However, there is no standard test method to verify systems safety.

Some methods are known but not generally applied by contractors.

Generally, known methods consist of some indirect measurements combined with analysis and calculation to prove that a certain safety margin exists. Each method has its own merit as well as deficiencies which may lead to over- or underdesign. The methods for the improvement of accuracy often require additional instrumentation and analysis and/or they do not provide continuous monitoring capability.

One known method is the voltage measurement method which consists of measuring RF voltages, induced in electroexplosive device lines by adjacent systems, across a substitute load by using voltmeters or oscilloscopes. The available power which may be absorbed by the squib is then derived by calculation, assuming that the load is a close equivalent of the squib. To be reliable, the method requires a knowledge of the impedance of the squib vs frequency which is a highly variable parameter depending also on the installation. The method does not lead to a systematic investigation of worst possible frequencies. Another limitation is the frequency range capability. To extend the range to 10 GHz, detector/amplifier circuits can be utilized, but still there will be the difficulty of relating the absorbed power to the voltage. Another method involves power measurement. A power meter, or a spectrum analyzer, connected to an electroexplosive device line, can show the available power, normally to a 50 ohm transmission system. Usually, to simulate the squib, a dummy load will be connected across the input terminals and the power absorbed by the load may be calculated. This calculation will be through the voltage parameter and the method, in reality, is a voltage measurement with all of the associated inaccuracies.

Another method is the stray energy monitor (SEM) method Electroexplosive device lines may be tested by substituting fuses (SEMS) for real squibs to determine a go/no-go condition at the end of a series of tests. If the fusing power of the SEM is a certain number of dB lower than the squib maximum no-fire power (MNFP), it may be concluded that the safety margin is better than that amount. Since the MNFPS of squibs vary to a large extent, depending on the model, a series of corresponding SEM fuses should be made available. The fusing sensitivity of SEMs are limited due to design difficulties. A practical SEM of 30 mW dc fusing power may provide 15 dB margin for one watt no-fire electroexplosive device. However, the impedance and fusing power of the SEMs vary with frequency, i.e., the firing voltage of the fuse may be much higher than that of the squib, and the safety margin, especially for sensitive squibs, may be negative. On the other hand, the SEM has the merit of responding to pin-to-case firing modes through the use of high resistance fuses.

As mentioned above, safety standards require that firing circuits shielding provide 40 to 60 dB attenuation. Shielding attenuation may be defined as the difference of coupling, to an external field, between unshielded wires, e.g. antennas, and shielded electroexplosives device lines. This coupling efficiency (field strength to the induced voltage ratio or antenna factor) of the electroexplosive device line, which is supposed to be a deficient antenna, can be measured by using signal sources, antennas, and field strength meters.

Besides providing voltage data, the method lends itself to a systematic survey and analysis. The inaccuracy lies in the difficulty of obtaining uniform fields in laboratory conditions but major design deficiencies are quickly detectable.

The present invention takes into consideration that the joule effect is the decisive end result and the invention provides a method directed towards measuring the effective power absorbed by the electroexplosive device. Since fuses and squibs have an appreciable temperature coefficient (approximately $10^{-3}$ ohms/° C./ohm), the measurement of the variation of the resistance may be used as a direct indication of dissipated power.

If a current of constant value is passed through a resistance, any variation in the value of the resistance will be reflected in changes in both power dissipated by the resistance and the voltage drop across the resistance. For example, if the current stays constant but the resistance doubles, the voltage and power will also double. If one passes a dc current of known value through a resistive device such as a SEM fuse or an electroexplosive device, the voltage across it will provide an indication of its resistance and the power dissipated by it. If the voltage due to the dc current has been previously determined, then any difference in voltage reading (and hence resistance and power dissipation) must be due to power induced by external sources in lines connected to the device. By knowing the maximum safe power dissipation (and hence voltage) of the device, the voltage reading provides an indication as to whether an unsafe level of power is being induced into the device.

Thus, in accordance with the present invention, there is provided a method of measuring the effective power absorbed by a resistive device due to radio-frequency energy induced in an electrical line connected to the device, comprising:

(a) connecting an adjustable source of constant dc current to the device in series with an ammeter and connecting a voltmeter across said device;

(b) passing current of varying levels through said device while measuring the current through it and the voltage across it, (c) recording voltage versus dc current for said device from the current and voltage measurements obtained in step (b);

(d) measuring voltage across the device while a dc current of known value is passed through it and while it is connected to said electrical line, (e) subtracting from the voltage measured in step (d) the voltage value obtained in step (c) for said dc current of known value to obtain the voltage produced by radio-frequency energy, said last named voltage being proportional to the effective power absorbed by the electroexplosive device.

The invention will now be further described in connection with the accompanying drawings, in which.

Figure 1:
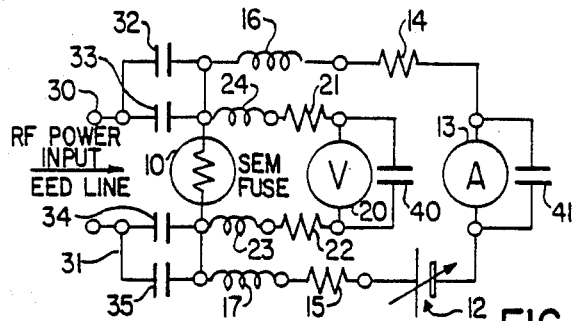
FIG. 1 is a schematic diagram of a circuit for calibrating an equivalent SEM fuse.

Referring to FIG. 1, a substitute fuse 10 is shown, to which is connected a variable constant current source 12, the current source 12 being connected in series with an ammeter 13, resistors 14 and 15 and chokes 16 and 17. A voltmeter 20 is connected across the SEM fuse 10 through resistors 21 and 22 and chokes 23 and 24. The fuse is also connected to an electrical line via terminals 30 and 31 through capacitors 32–35. The capacitors 32–35 at the rf input provide a low reactance path at low and high frequencies. The chokes 16, 17, 23 and 24 isolate the dc current and voltage lines. The capacitors 40 and 41 across the voltmeter 20 and ammeter 13 may reduce the susceptibility of these instruments to emissions.

The method according to the invention may be called the "dc power-assisted RF power measurement".

Figure 2:
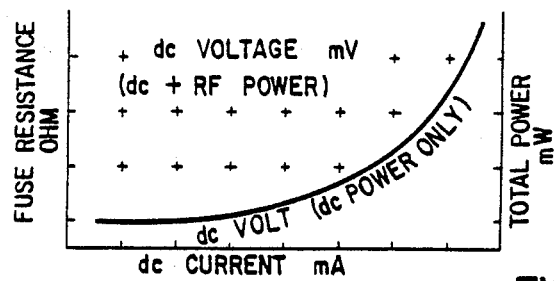
FIG. 2 is a graphical illustration of measurements obtained by the circuitry of FIG. 1.

The variable supply 12 permits calibration of a resistive device, in this case an equivalent SEM fuse, with the results as shown in FIG. 2. By varying the current from the dc supply 12, one can obtain a series of dc voltage and current measurements for the SEM fuse. Power dissipation and resistance vary in the same manner as voltage so that a plot of voltage vs. current also provides a plot of resistance and power dissipation vs. current.

The circuit shown in FIG. 1 has an rf sensitivity of better than one millivolt per milliwatt without recourse to a dc voltage amplifier.

After calibration of the SEM fuse, the circuit may be connected to the electrical line at terminals 30 and 31. While passing a dc current of known valve through the SEM fuse measurements may be made of total power dissipation and, by subtracting power due to the dc current source, one obtains power dissipation due to rf energy induced in the electrical line.

Figure 3:
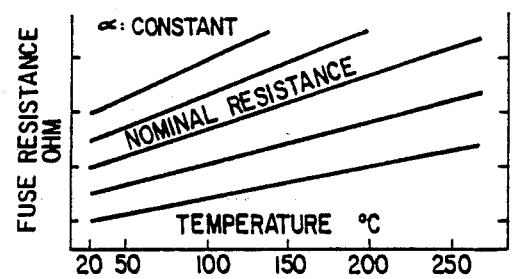
FIG. 3 is a diagram illustrating variations of fuse resistance with temperature.
Figure 4:
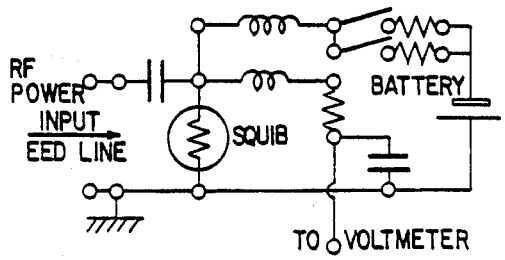
FIG. 4 is a schematic diagram of a circuit which may be used on a vehicle.

The method also lends itself to the measurement of the minimum temperature of a fuse through a calibration process (FIG. 3) which may be carried out in a temperature chamber. An actual squib, with some explosive-safety-measures, may be used to extract the real data by following the same calibration and measurement procedure, as detailed above, for the squib under consideration. For on-the-vehicle utilization (e.g. aircraft in flight) the adjustable current supply will be replaced by a battery and the ammeter may be omitted (FIG. 4) to provide a grounded (unbalanced) configuration less susceptible to emissions. The device may be mounted on a plug, for example, directly at the base of a rocket launcher tube. The voltmeter lead may be connected to the instrumented cockpit by a shielded line.

The method does have somewhat low sensitivity but it may be increased by augmenting the dc current or by the addition of an amplifier. The characteristics of the electrical line may be altered by the addition of a capacitor or resistor but this is preferable to altering the electrical and thermal characteristics of the squib by inserting thermocouples or other components into it. Care should be taken to maintain the temperature of the squib, and therefore the reference voltage reading, constant during air tests. Also, if a digital voltmeter is used, they are somewhat susceptible to electromagnetic fields.

Despite these problems, which can be remedied satisfactorily, the method has a number of advantages which outweigh them, as follows:

(1) the measurement of the real power absorbed by the electroexplosive device with little recourse to analysis, except a calibration process, (2) usability of the method under field conditions, e.g. during flight tests, (3) simplicity of instrumentation, (4) continuous monitoring capability, (5) response to pulsed signals, (6) no need to design expensive dummy devices for each model to be tested, and (7) no alteration of the electrical and thermal characteristics of the electroexplosive device.

Thus, the method according to the invention enables, without requiring an amplifier, at least one milliwatt sensitivity for a reliable measurement of the real power dissipated in squibs (explosive initators). For a 20 db safety margin, the method is usable for squibs with down to 100 mW maximum no-fire power, and provides continuous monitoring capabilities. Antenna factor measurement of electroexplosive device lines which may reveal the critical frequency ranges before hand is also recommended.

The invention can be applied to the testing of electroexplosive lines and services in the military sector, aerospace engineering, civil engineering, construction work, etc. The invention provides safety measures for weapons, rockets, explosives, squibs, flares, igniters, etc.

The embodiments of the invention in which an exclusive property of privilege is claimed are defined as follows:

1. A method of measuring the effective power absorbed by a resistive device due to radio-frequency energy induced in an electrical line connected to the device, comprising:

(a) connecting an adjustable source of constant dc current to the device in series with an ammeter and connecting a voltmeter across said device;

(b) passing current of varying levels through said device while measuring the current through it and the voltage across it, (c) recording voltage versus dc current for said device from the current and voltage measurements obtained in step (b);

(d) measuring voltage across the device while a dc current of known value is passed through it and while it is connected to said electrical line, (e) subtracting from the voltage measured in the step (d) the voltage value obtained in step (c) for said dc current of known value to obtain the voltage produced by radio-frequency energy, said last named voltage being proportional to the effective power absorbed by the device.

2. A method as claimed in claim 1 wherein the current of known value is obtained from a constant current source.

3. A method as claimed in claim 1 wherein the dc current is connected via chokes to block rf current from the electrical line.

4. A method as claimed in claim 1 wherein the electrical line is connected via capacitors to block dc current from the source of dc current.

5. A method as claimed in claim 1, 2 or 3 wherein said resistive device is a SEM fuse.

6. A method as claimed in claim 4 wherein said resistive device is a SEM fuse.

7. A method as claimed in claim 1, 2 or 3 wherein said resistive device is a squib.

8. A method as claimed in claim 4 wherein said resistive device is a squib.

* * * * *